(12) United States Patent
Lee et al.

(10) Patent No.: US 8,722,513 B2
(45) Date of Patent: May 13, 2014

(54) SEMICONDUCTOR CHIP STACK PACKAGE AND MANUFACTURING METHOD THEREOF

(75) Inventors: Jae-Hak Lee, Daejeon (KR); Chang-Woo Lee, Daejeon (KR); Joon-Yub Song, Daejeon (KR); Tae-Ho Ha, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 0 days.

(21) Appl. No.: 13/391,063

(22) PCT Filed: Feb. 22, 2011

(86) PCT No.: PCT/KR2011/001166
§ 371 (c)(1),
(2), (4) Date: Feb. 17, 2012

(87) PCT Pub. No.: WO2012/086871
PCT Pub. Date: Jun. 28, 2012

(65) Prior Publication Data
US 2013/0256911 A1    Oct. 3, 2013

(30) Foreign Application Priority Data
Dec. 21, 2010 (KR) .................. 10-2010-0131939

(51) Int. Cl.
*H01L 21/30* (2006.01)
*H01L 21/31* (2006.01)

(52) U.S. Cl.
USPC ........... 438/455; 438/974; 438/763; 438/109; 438/118; 438/617; 257/E23.134; 257/E21.499

(58) Field of Classification Search
CPC ......... H01L 21/30; H01L 21/31; H01L 21/44; H01L 21/50
USPC .................. 438/455, 974, 928, 617, 118, 109; 257/E21.499, E23.134
See application file for complete search history.

(56) References Cited

U.S. PATENT DOCUMENTS 7,598,153 B2 * 10/2009 Henley et al. ................. 438/455
8,373,283 B2 *  2/2013 Masuko et al. ............... 257/783
8,387,238 B2 *  3/2013 Sheats ............................ 29/825
(Continued)

FOREIGN PATENT DOCUMENTS

JP    2009-267127    11/2009
KR    10-2001-0095678    11/2001
(Continued)

OTHER PUBLICATIONS

Jae Hak Lee et al., Pre-Bonding Method using Self-Alignment Effect for Multichip Packaging, IEEE 2009 International Symposium on Assembly and Manufacturing, Nov. 17-20, 2009, p. 118-123, Suwon, Korea.

(Continued)

*Primary Examiner* — Nitin Parekh
(74) *Attorney, Agent, or Firm* — Lexyoume IP Meister, PLLC

(57) ABSTRACT

The present invention relates to a semiconductor chip stack package and a manufacturing method thereof, and more particularly, to a semiconductor chip stack package and a manufacturing method thereof in which a plurality of chips can be rapidly arranged and bonded without a precise device or operation so as to improve productivity.

8 Claims, 8 Drawing Sheets

(56) References Cited

U.S. PATENT DOCUMENTS

| | | | |
|---|---|---|---|
| 2007/0037321 A1* | 2/2007 | Higashino et al. | 438/109 |
| 2008/0315433 A1 | 12/2008 | Chen et al. | |
| 2009/0311827 A1* | 12/2009 | Ishizawa et al. | 438/107 |
| 2010/0187002 A1 | 7/2010 | Lee et al. | |
| 2010/0230794 A1 | 9/2010 | Li et al. | |
| 2011/0223397 A1* | 9/2011 | Kawamori et al. | 428/195.1 |

FOREIGN PATENT DOCUMENTS

| | | |
|---|---|---|
| KR | 10-2002-0053739 | 7/2002 |
| KR | 10-623227 | 9/2006 |
| KR | 10-2009-0049442 | 5/2009 |
| KR | 10-2009-0050149 | 5/2009 |
| KR | 10-2009-0098067 | 9/2009 |
| KR | 10-2009-0106822 | 10/2009 |
| KR | 10-2010-0036064 | 4/2010 |
| KR | 10-2010-0087932 | 8/2010 |
| KR | 10-2010-0112890 | 10/2010 |

OTHER PUBLICATIONS

T.Fukushima et al., Mutichip Self-Assembly Technique on Flexible Polymeric Substrate, IEEE 2008 Electronic Components and Technology Conference, May 27-30, 2008, p. 1532-1537, Sendai, Japan.

* cited by examiner

SEMICONDUCTOR CHIP STACK PACKAGE AND MANUFACTURING METHOD THEREOF

TECHNICAL FIELD

The present invention relates to a semiconductor chip stack package and a manufacturing method thereof, and more particularly, to a semiconductor chip stack package and a manufacturing method thereof in which a plurality of chips can be rapidly arranged and bonded without a precise device or operation so as to improve productivity.

BACKGROUND ART

Electronic package technology is very broad, and includes various system manufacturing technologies including all the processes from a semiconductor device to a final product. In particular, with the rapid development of electronic products, electronic package technology is a very important for achieving compactness, lightness, and high performance of devices.

Electronic package technology is also a very important technology for determining performance, size, price, reliability, etc., of final electronic products. In particular, in recent electronic products pursuing high electrical performance, subminiature/high density, low power, multi-function, ultra-high speed signal processing, and permanent reliability, the subminiature package parts are needed as essential parts for computers, information communication devices, mobile communication devices, premium home appliances, etc.

An example of a representative technology of three-dimensionally stacking semiconductor devices including chips to connect the semiconductor devices or mount the semiconductor devices on a substrate may include wire bonding technology, flip chip technology, and through silicon via (TSV) technology.

Wire bonding technology, which is a technology of attaching and connecting a wire to a metal pad of a connection part using an ultrasonic tool, is inexpensive in view of manufacturing costs but has a limitation in connecting fine pitches and high-density electrodes due to the bonding between the wire and the metal pad, and cannot be used for parts requiring ultrahigh speed signal processing due to an increase in parasitic inductance according to an increase in the length of the signal line for electrically connecting between the connection parts.

The flip chip technology is largely divided into two, i.e., a solder flip chip using solder and a non-solder flip chip not using solder. The solder flip chip has problems in that production cost is increased due to a very complicated connection process such as solder flux application, chip/substrate alignment, solder bump reflow, flux removal, underfill filling, curing, etc. Therefore, recently, the non-solder flip chip technology has gained a large amount of interest in order to reduce the number of complicated processes.

A representative technology of the non-solder flip chip is a flip chip technology using an anisotropic conductive film (ACA). The flip chip technology using the existing ACA includes a process in which an ACA material is applied or temporarily bonded to substrates and the chips and the substrates are aligned, and heat and pressure are finally applied thereto to complete the flip chip package. However, the process has a long process time in forming a film or applying or temporarily bonding the ACA material to each substrate.

The through silicon via (TSV), which is a package scheme of forming an electrode by punching a silicon wafer, has been in the limelight as a 3D packaging technology that can remarkably reduce power consumption while preventing high-frequency signal loss and seldom causes a signal delay in order to meet compactness, high speed, and low power performance objectives.

The through silicon via (TSV) is manufactured by a technology of filling via holes formed on separate silicon wafers (or chips) and then stacking the plurality of wafers (or chips) with the via holes filled.

Meanwhile, since the above-mentioned methods must accurately adjust alignment positions by using a unit transporting the chips at the time of aligning the plurality of chips, they require high-price equipment and are long in required process time.

Further, since a possibility that defects will occur, productivity deteriorates.

As a result, technology to improve accuracy while rapidly aligning the chips is required.

The above information disclosed in this Background section is only for enhancement of understanding of the background of the invention and therefore it may contain information that does not form the prior art that is already known in this country to a person of ordinary skill in the art.

DISCLOSURE

Technical Problem

The present invention has been made in an effort to provide a semiconductor chip stack package and a manufacturing method thereof having advantages of simplifying a process through self-alignment of chips by using a simple method of hydrophilic surface treatment and improving the accuracy of chip alignment at the time of aligning the chips.

Further, the present invention has been made in an effort to provide a semiconductor chip stack package and a manufacturing method thereof having advantages of simplifying a manufacturing process, improving productivity, and having uniform quality.

Technical Solution

An exemplary embodiment of the present invention provides a manufacturing method of a semiconductor chip stack package, the method including: forming a chip in which an interconnection pad is formed on one surface thereof; performing hydrophilic surface treatment of an attachment surface of the chip to have a hydrophilic surface; performing hydrophobic surface treatment of a region of the attachment surface of the chip subjected to the hydrophilic surface treating that does not contact another chip to have a hydrophobic surface; aligning chips of regions where a hydrophilic surface treated portion is exposed to contact each other; firstly fixing the chips by applying heat or pressure; and bonding wires to respective interconnection pads of the aligned chips.

In this case, in the hydrophilic surface treatment, a layer using a hydrophilic material may be formed on the attachment surface of the chip.

Further, the hydrophilic surface treatment may be plasma processing.

In the aligning, water drop may be applied to one surface of each of the chips, and thereafter the chips may contact each other to be self-aligned.

In the hydrophobic surface treatment, a hydrophobic material may be applied to the chip subjected to the hydrophilic surface treatment.

The hydrophobic material may include $CF_4$, a self-assembled monolayer (SAM), or polytetrafluoroethylene (PTFE).

In the manufacturing method of the semiconductor chip stack package, after the firstly fixing the chip, the circumferences of the stacked chips may be secondly fixed by using an adhesive.

The steps of the hydrophilic surface treatment through the bonding of the wires may be repeatedly performed depending on the number of stacked chips.

Another exemplary embodiment of the present invention provides a semiconductor chip stack package, including: a plurality of chips having a plate shape in which an interconnection pad is formed on one surface thereof and having a hydrophilic surface except for a predetermined region where the interconnection pad is formed to be fixed to each other by self-aligning; and wires connected to the interconnection pads of the chips.

Advantageous Effects

According to the exemplary embodiments of the present invention, a semiconductor chip stack package and a manufacturing method thereof can simplify a process through self-alignment by using hydrophilic surface treatment and improve the accuracy of chip alignment at the time of aligning the chips.

Further, according to the exemplary embodiments of the present invention, a semiconductor chip stack package and a manufacturing method thereof can simplify a manufacturing process, improve productivity, and have uniform quality.

Figure 1:
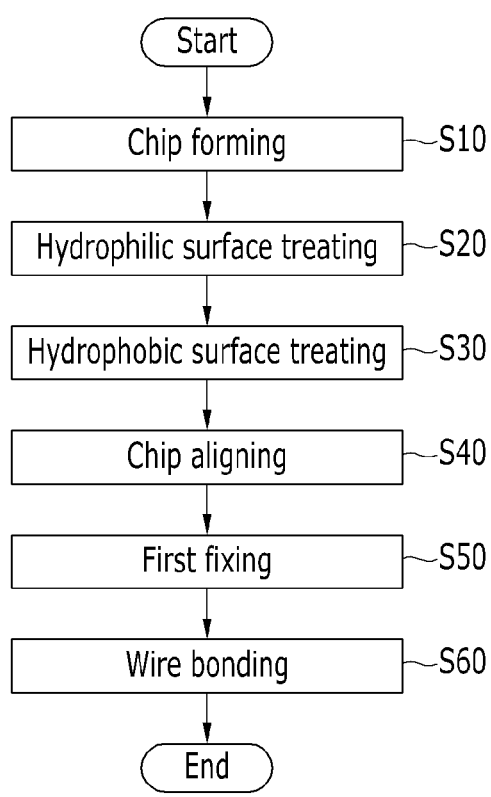
FIG. 1 is a flowchart of a manufacturing method of a semiconductor chip stack package according to an exemplary embodiment of the present invention.

<Description of Reference Numerals Indicating Primary Elements in the Drawings>

1000: Semiconductor chip stack package
100: Chip
101: Interconnection pad
210: Hydrophilic material
220: Hydrophobic material
300: Wire
S10-S70: Steps of manufacturing method of semiconductor chip stack package according to an exemplary embodiment of the present invention

MODE FOR INVENTION

Before detailed content for implementing the present invention is described, a configuration that does not directly relate to the technical gist of the present invention is omitted in the range that deranges the technical gist of the present invention.

In addition, terms or words that are used in the present specification and claims should be understood as meanings and concepts that correspond to the technical spirit of the present invention in consideration of the principle that the concept of the term can be appropriately defined in order to describe the invention by using the best method by the inventor.

Hereinafter, a semiconductor chip stack package 1000 and a manufacturing method thereof according to exemplary embodiments of the present invention will be described in detail with reference to the accompanying drawings.

First, referring to FIG. 1, the manufacturing method of the semiconductor chip stack package 1000 according to the exemplary embodiment of the present invention includes a chip forming step (S 10), a hydrophilic surface treating step (S20), a hydrophobic surface treating step (S30), a chip 100 aligning step (S40), a first fixing step (S50), and a wire 300 bonding step (S60).

The chip forming step (S10) is a step of forming a chip 100 which is a basic component configuring the semiconductor chip stack package 1000. The chip 100 is formed in a plate shape and includes an interconnection pad 101 including a metal terminal for the wire 300 through stacking.

In the chip forming step (S10), the stacked chip 100 is prepared.

In the hydrophilic surface treating step, a surface of the chip 100 manufactured through the chip forming step (S10) is treated to have a hydrophilic surface.

In this case, since two or more chips 100 may be stacked in the semiconductor chip stack package 1000 according to the exemplary embodiment, the chip 100 positioned at the lowermost side or uppermost side may be subjected to hydrophilic surface treatment on only one surface thereof and the chip 100 positioned in the middle may be subjected to hydrophilic surface treatment at both surfaces thereof.

Moreover, hydrophilic surface treatment may be performed with respect to all chips 100 used following the chip forming step (S10), and after one chip 100 is stacked, hydrophilic surface treatment may be performed again. This will be described below again.

The hydrophilic surface treatment may be generally performed by forming a layer using a hydrophilic material 210 having a hydrophilic property.

As the hydrophilic material 210, an oxide or a low-temperature liquefied glass material such as spin on glass (SOG) may be used.

Further, as the hydrophilic material 210, a polymer material having a hydrophilic property may be used.

The oxide serves as an adhesive as well as allows the chip to have a hydrophilic surface to improve bonding strength of the stacked chips 100.

Moreover, the hydrophilic surface treating step (S20) may be performed by plasma processing.

Figure 2:
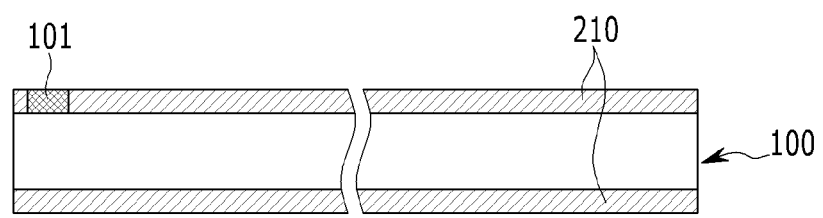
FIGS. 2 to 5 are schematic diagrams showing steps of the manufacturing method of a semiconductor chip stack package according to an exemplary embodiment of the present invention.

FIG. 2 shows a state in which both an upper part and a lower part of the chip 100 are surface-treated by the hydrophilic material 210.

In the hydrophobic surface treating step (S30), since a portion where the interconnection pad 101 of the chip 100 is formed is the portion that should be protruded outwardly without contacting the chip 100, a predetermined region including the interconnection pad 101 on an attachment surface of the chip 100 that is subjected to the hydrophilic surface treatment is treated to have a hydrophilic surface.

The hydrophobic surface treating step (S30) allows a region that does not contact another chip 100 of the attachment surface of the chip 100 to have the hydrophobic surface, and in this step, a region where the interconnection pad 101 is formed on one surface of the chip 100 is subjected to hydrophobic surface treatment.

Figure 9:
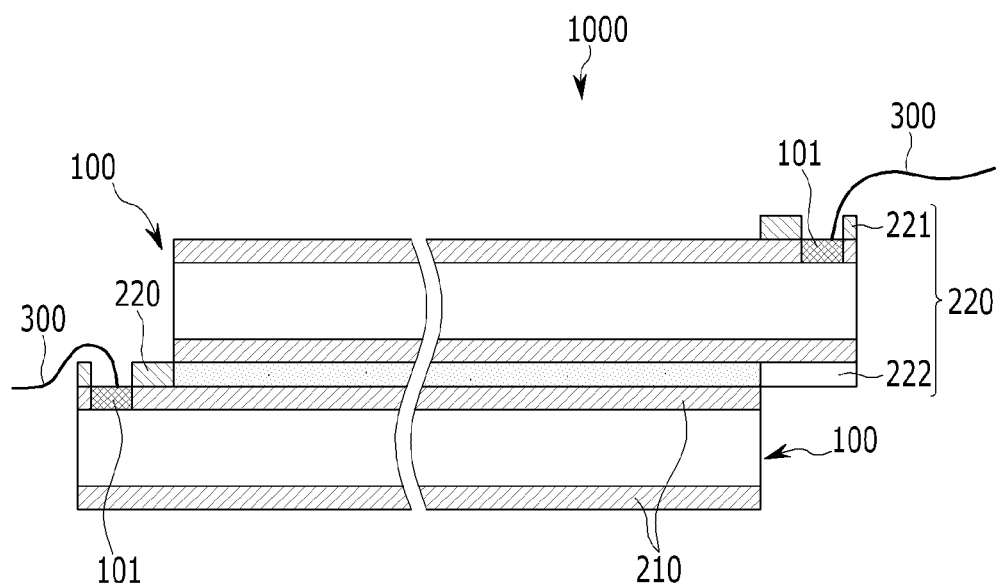
FIG. 9 is diagram showing a semiconductor chip stack package according to another exemplary embodiment of the present invention.

In this case, even a region that is protruded outwardly, which is a region opposed to the position of the interconnection pad 101 on the other surface of the chip 100, may be subjected to the hydrophobic surface treatment (see FIG. 9). In FIG. 9, a hydrophobic material 220 formed on the surface where the interconnection pad 101 is formed is represented by reference numeral 221 and a hydrophobic material 220 formed on a surface where the interconnection pad 101 is not formed is represented by reference numeral 222.

Figure 3:
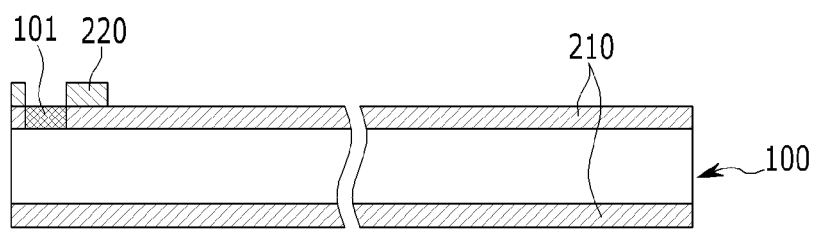

The hydrophobic surface treating step (S30) may be performed by applying the hydrophobic material 220 that may include $CF_4$, a self-assembled monolayer (SAM), or polytetrafluoroethylene (PTFE, Teflon®) (see FIG. 3).

As a result, in the manufacturing method of the semiconductor chip stack package 1000 according to the exemplary embodiment of the present invention, while self-alignment of the chips 100 is made through the hydrophilic surface treating step, the chips 100 contact each other only in the remaining region that is subjected to the hydrophobic surface treatment through the hydrophobic surface treating step (S30) in a predetermined region, such that the chips 100 can be rapidly and stably aligned without using a precise transferring device.

Figure 4:
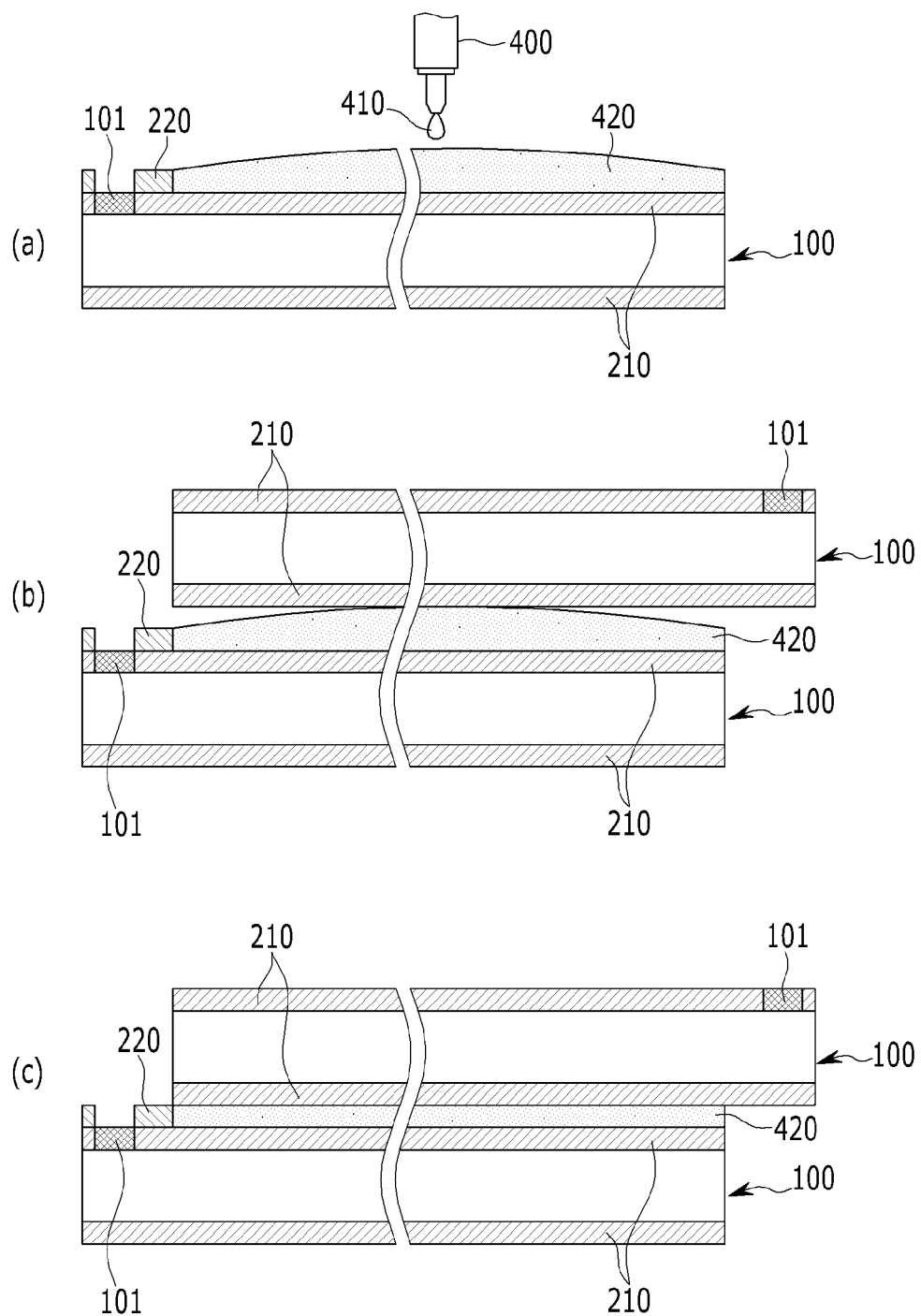
Figure 5:
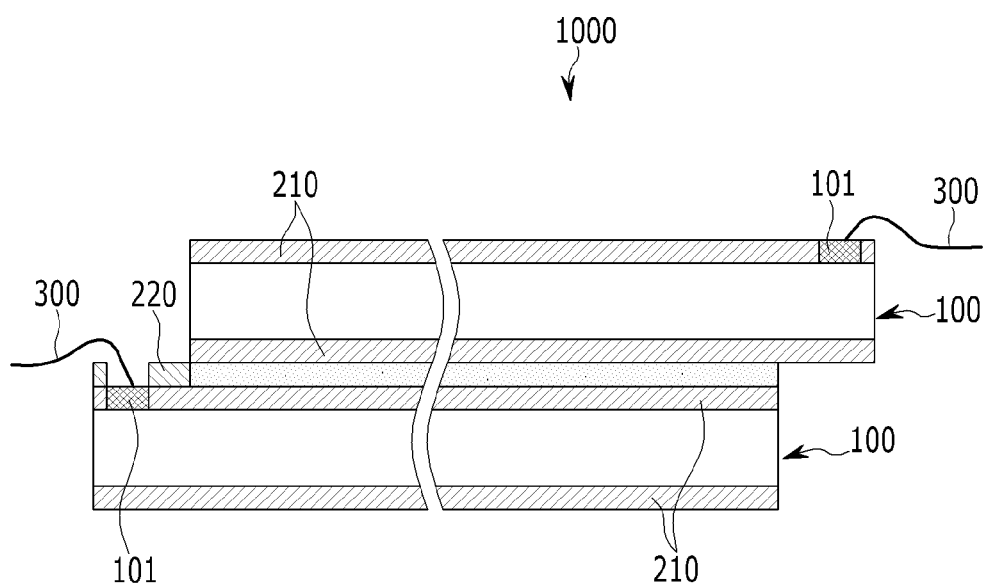

In the chip 100 aligning step, regions of chips 100 where the portion that is subjected to the hydrophilic surface treatment is exposed contact each other to be aligned, and as shown in FIG. 4, water drop 410 is applied to one portion of a surface-treated chip 100 to form a wetting layer 420 and then the corresponding chip 100 and another chip 100 contact each other with the wetting layer 420 interposed therebetween to be self-aligned. In FIG. 4, a unit for applying the water drop is represented by reference numeral 400.

As shown in (a) of FIG. 4, the wetting layer 420 is formed to the chip 100, and as shown in (b) FIG. 4, when the corresponding chip 100 and another chip 100 contact each other, the chips are aligned as shown in (c) FIG. 4.

In this case, the interconnection pads 101 of the stacked chips 100 are positioned at the same portion in a stacking direction (an upper portion in the figure), and the interconnection pads 101 are positioned to be opposed to each other in a direction perpendicular to the stacking direction of the chips 100.

Further, in the case when a plurality of chips are stacked, the interconnection pads formed in the chips 100 in the stacking direction are positioned alternately at the left side and the right side as shown in the figure.

The chips 100 are temporarily bonded to each other through the chip 100 aligning step (S40), and the fixing strength thereof is further improved through the first fixing step (S50).

The first fixing step (S50) as the step of applying heat or pressure may be performed by applying heat, pressure, or both heat and pressure.

In the wire 300 bonding step (S60), the wire 300 is attached to the interconnection pad 101 of the fixed chip 100.

Figure 6:
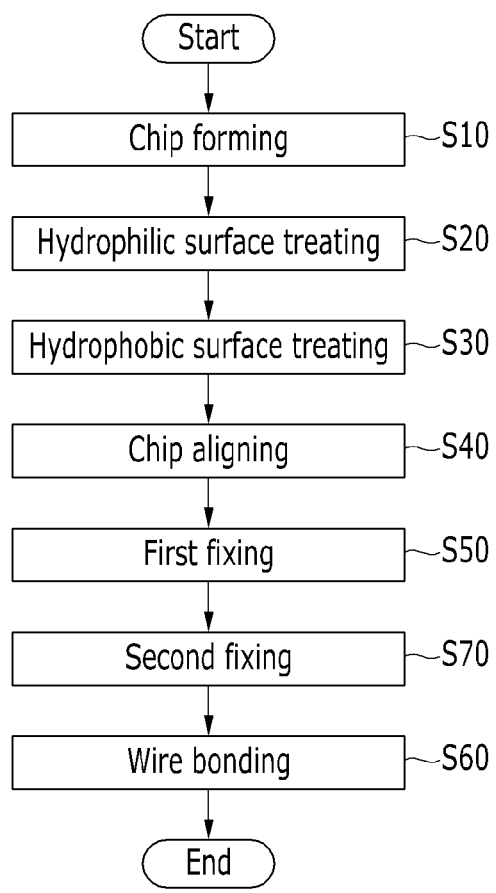
FIG. 6 is a flowchart of the method of a semiconductor chip stack package according to another exemplary embodiment of the present invention.

Referring to FIG. 6, in the manufacturing method of the semiconductor chip stack package 1000 according to another exemplary embodiment of the present invention, a second fixing step (S70) of fixing the circumference of the stacked chip 100 by using an adhesive between the first fixing step (S50) and the wire 300 bonding step is performed.

In this case, in the second fixing step (S70), a liquefied or paste-type epoxy, a silver (Ag) paste, a silicon adhesive, and the like may be used.

Figure 7:
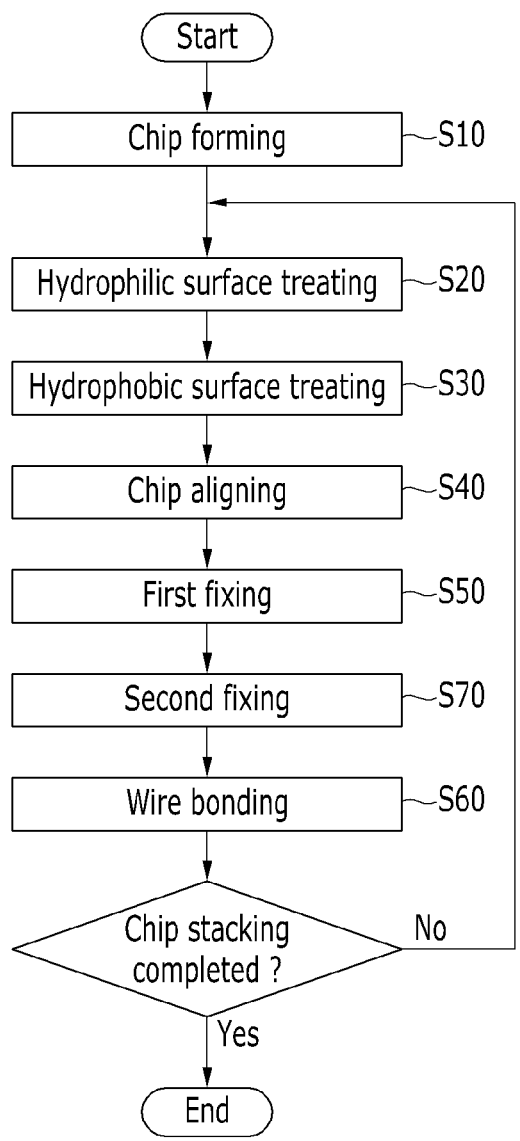
FIG. 7 is a flowchart of the method of a semiconductor chip stack package according to yet another exemplary embodiment of the present invention.

Further, referring to FIG. 7, in the manufacturing method of the semiconductor chip stack package 1000 according to the exemplary embodiment of the present invention, the hydrophilic surface treating step (S20) to the wire 300 bonding step (S60) may be repeatedly performed depending on the number of stacked chips 100.

Figure 8:
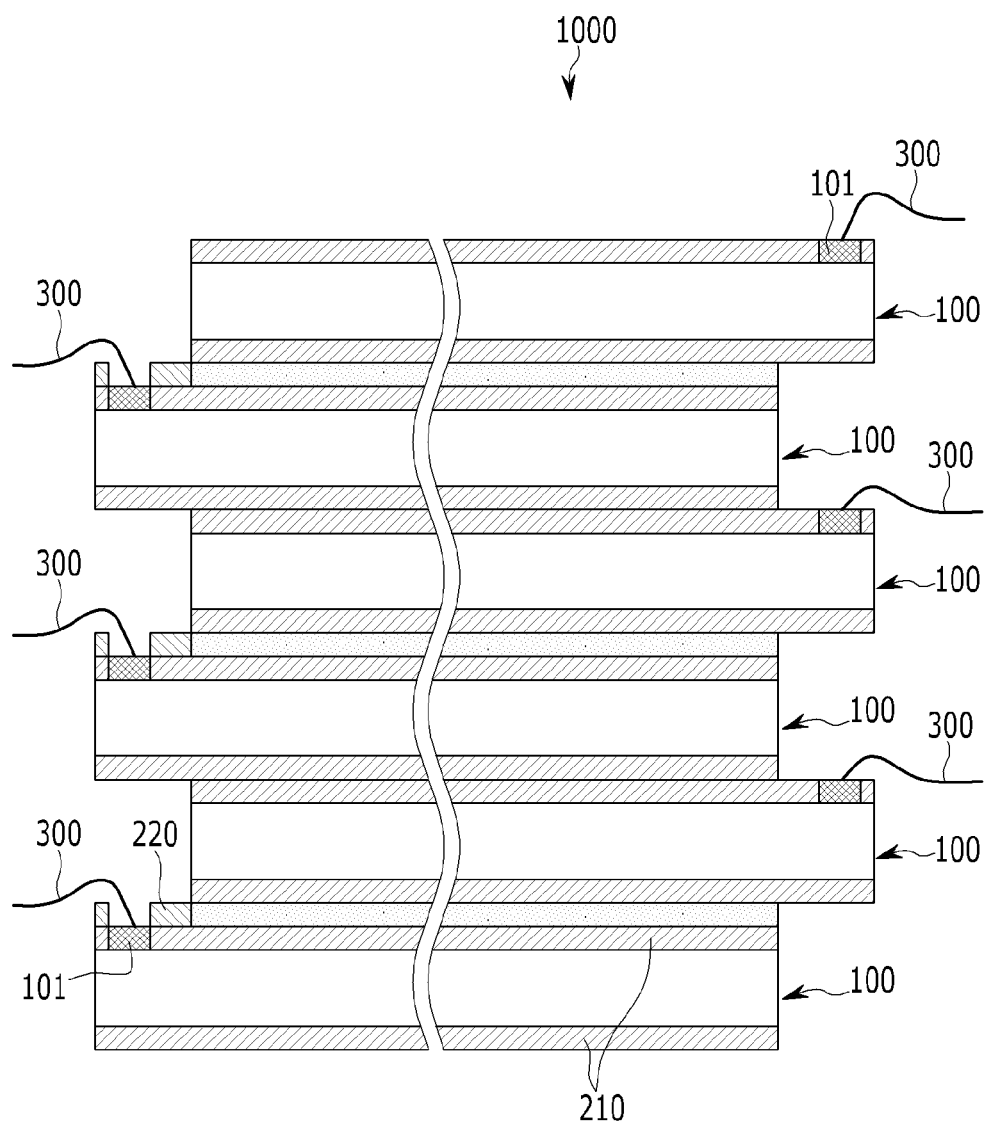
FIG. 8 is a diagram showing a semiconductor chip stack package according to an exemplary embodiment of the present invention.

In this case, when all the chips 100 used are first subjected to the hydrophilic surface treating step (S20) and the hydrophobic surface treating step (S30), the chip 100 aligning step (S40) through the wire 300 bonding step (S60) are repeatedly performed (see FIG. 8).

Therefore, the manufacturing method of the semiconductor chip stack package 1000 according to the exemplary embodiment of the present invention can simplify a process through self-alignment by using hydrophilic surface treatment and improve the accuracy of alignment of the chips 100.

A semiconductor chip stack package 1000 according to the exemplary embodiment of the present invention is manufactured by the above-mentioned manufacturing method.

More specifically, the semiconductor chip stack package 1000 according to the exemplary embodiment of the present invention includes a plurality of chips 100 and wires 300 connected to interconnection pads 101 of the chip 100.

In this case, the chips 100 have a plate shape in which the interconnection pads 101 are formed on one surface thereof and have hydrophilic surfaces except for predetermined regions where the interconnection pads 101 are formed to be fixed to each other by self-alignment.

As shown in FIG. 9, when the plurality of chips 100 are stacked, an upper portion and a lower portion of the chip 100 positioned therebetween are both subjected to hydrophilic surface treatment, and predetermined regions of the upper and lower portions may be both subjected to hydrophobic surface treatment by using hydrophobic materials 221 and 222.

In other words, referring to the chip 100 having the interconnection pad 101 at an upper right portion among the chips 100 positioned at the center, the corresponding chip 100 has no interconnection pad 101 with the chip 100 positioned thereabove, but the two chips 100 are bonded to each other except for a hydrophobic surface treated region 222 at a lower right portion and has the interconnection pad 101 with the chip 100 positioned therebelow and the two chips 100 are bonded to each other except for a hydrophobic surface treated region 221 at a lower left portion.

That is, even when a surface without the interconnection pad 101 is subjected to the hydrophobic surface treatment, hydrophilic surfaces of the chips 100 to contact each other accurately coincide with each other, thereby further improving precision.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A manufacturing method of a semiconductor chip stack package, the method comprising:

forming a chip in which an interconnection pad is formed on one surface thereof;

performing hydrophilic surface treatment of an attachment surface of the chip to have a hydrophilic surface;

performing hydrophobic surface treatment of a region of the attachment surface of the chip subjected to the hydrophilic surface treating that does not contact another chip to have a hydrophobic surface, the another chip having an interconnection pad exposed through a hydrophilic surface and being positioned opposite to the interconnection pad of the chip in a direction perpendicular to a stacking direction of the chips;

aligning regions of the chips where a hydrophilic surface treated portion on each chip being partially exposed to contact each other;

firstly fixing the chips; and bonding wires to respective interconnection pads of the aligned chips.

2. The method of claim 1, wherein in the hydrophilic surface treatment, a layer using a hydrophilic material is formed on the attachment surface of the chip.

3. The method of claim 1, wherein the hydrophilic surface treatment is plasma processing.

4. The method of claim 1, wherein in the aligning, water drop is applied to one surface of each of the chips to form a wetting layer, and thereafter the chips contact each other to be self-aligned.

5. The method of claim 1, wherein in the hydrophobic surface treatment, a hydrophobic material is applied to the chip subjected to the hydrophilic surface treatment.

6. The method of claim 5, wherein the hydrophobic material is selected from a group consisting $CF_4$, a self-assembled monolayer (SAM), or polytetrafluoroethylene (PTFE).

7. The method of claim 1, wherein after the firstly fixing the chips, the circumferences of the stacked chips are secondly fixed by using an adhesive.

8. The method of claim 1, wherein the hydrophilic surface treatment, hydrophobic surface treatment and the bonding of the wires are repeatedly performed for a predetermined duration of time.

* * * * *